(12) United States Patent
Chamla et al.

(10) Patent No.: US 7,511,570 B2
(45) Date of Patent: Mar. 31, 2009

(54) TRANSCONDUCTANCE FILTERING CIRCUIT

(75) Inventors: David Chamla, Grenoble (FR); Andreia Cathelin, Laval (FR); Andreas Kaiser, Villeneuve d' Ascq (FR)

(73) Assignees: STMicroelectronics SA, Montrouge (FR); Centre National de la Recherche Scientifique (CNRS), Paris (FR)

( * ) Notice: Subject to any disclaimer, the term of this patent is extended or adjusted under 35 U.S.C. 154(b) by 90 days.

(21) Appl. No.: 11/648,146

(22) Filed: Dec. 29, 2006

(65) Prior Publication Data

US 2007/0194854 A1  Aug. 23, 2007

(30) Foreign Application Priority Data

Dec. 30, 2005  (FR) .................................. 05 13488

(51) Int. Cl.
*H03B 1/00* (2006.01)
*H03K 5/00* (2006.01)
*H04B 1/10* (2006.01)

(52) U.S. Cl. ...................... 327/552; 327/553; 327/554; 327/555; 327/556; 327/557; 327/558; 327/559

(58) Field of Classification Search .......... 327/552–559
See application file for complete search history.

(56) References Cited

U.S. PATENT DOCUMENTS

| | | | | | |
|---|---|---|---|---|---|
| 4,204,170 | A | * | 5/1980 | Kage | ........................... 327/552 |
| 4,255,724 | A | * | 3/1981 | Bergero | ...................... 333/17.2 |
| 4,621,217 | A | * | 11/1986 | Saxe et al. | ...................... 315/1 |
| 5,491,453 | A | * | 2/1996 | Ichihara | ...................... 327/553 |
| 5,576,646 | A | * | 11/1996 | Rezzi et al. | .................. 327/103 |
| 5,912,583 | A | * | 6/1999 | Pierson et al. | ............... 327/553 |
| 6,140,866 | A | * | 10/2000 | Wang | ........................... 327/552 |
| 6,184,748 | B1 | * | 2/2001 | Rao et al. | ..................... 327/552 |
| 6,335,655 | B1 | * | 1/2002 | Yamamoto | .................. 327/552 |
| 6,556,073 | B2 | * | 4/2003 | Morie et al. | ................. 327/554 |
| 6,838,929 | B2 | * | 1/2005 | Mitteregger | ................. 327/553 |
| 6,930,544 | B2 | * | 8/2005 | Yokoyama | .................. 327/552 |
| 7,002,403 | B2 | * | 2/2006 | Marholev | ..................... 327/552 |
| 7,006,805 | B1 | * | 2/2006 | Sorrells et al. | ........... 455/188.1 |
| 7,009,446 | B2 | * | 3/2006 | Yoshida et al. | ............... 327/552 |
| 7,019,586 | B2 | * | 3/2006 | Dong | .......................... 327/553 |
| 7,196,574 | B1 | * | 3/2007 | Vishinsky | .................... 327/557 |
| 2001/0020865 | A1 | * | 9/2001 | Morie et al. | ................. 327/552 |
| 2001/0048342 | A1 | * | 12/2001 | Yoshida et al. | ............... 327/552 |
| 2004/0085123 | A1 | * | 5/2004 | Mitteregger | ................. 327/552 |
| 2005/0151582 | A1 | * | 7/2005 | Bailey et al. | ................. 327/552 |

(Continued)

OTHER PUBLICATIONS

Randall L. Geiger et al., "Active Filter Design Using Operational Transconductance Amplifiers: A Tutorial," IEEE Circuits and Devices Magazine, Mar. 1985, pp. 20-32.

*Primary Examiner*—Lincoln Donovan
*Assistant Examiner*—Adam Houston

(57) ABSTRACT

A transconductance filtering device with a flexible architecture that can selectively present a different topology and/or order beginning with the same initial structure is disclosed. For example, depending on the communications standard detected, the elementary cells of the filtering circuit required to form the adapted filter are selected and connected in such a manner as to obtain the configuration desired for the filtering means. As an example, the filter may be for use with a wireless communications system forming, in particular, a cellular mobile telephone. The filter is configurable by means of at least two elementary cells of the same structure and of controllable interconnection means each having an open or closed state.

20 Claims, 6 Drawing Sheets

U.S. PATENT DOCUMENTS

2005/0153664 A1* 7/2005 Moloudi et al. ............... 455/78
2005/0253633 A1* 11/2005 Kimura ...................... 327/156
2006/0164159 A1* 7/2006 Kimura ...................... 327/552
2006/0262880 A1* 11/2006 Mizuta et al. ............... 375/297
2007/0182480 A1* 8/2007 Kimura ...................... 327/552
2007/0188237 A1* 8/2007 Chamla et al. ............. 330/295

* cited by examiner

TRANSCONDUCTANCE FILTERING CIRCUIT

CROSS-REFERENCE TO RELATED APPLICATIONS

The present application is related to French Patent Application No. 0513488, filed Dec. 30, 2005, entitled "TRANSCONDUCTANCE FILTERING CIRCUIT, IN PARTICULAR FOR A CELLULAR TELEPHONE". French Patent Application No. 0513488 is assigned to the assignee of the present application and is hereby incorporated by reference into the present disclosure as if fully set forth herein. The present application hereby claims priority under 35 U.S.C. §119(a) to French Patent Application No. 0513488.

TECHNICAL FIELD

The disclosure relates to filtering circuits, in particular those incorporating transconductance amplifiers in various applications such as, for example, applications associated with cellular telephone systems.

BACKGROUND

A conventional cellular telephone may be configured to operate according to a number of different transmission standards such as, for example, the Global System for Mobile Telecommunications (GSM) standard, or the Universal Mobile Telecommunications System (UMTS) standard.

A cellular telephone typically includes a filter within its signal transmission and/or receive channels such as, for example, an anti-aliasing filter or a channel selection filter (of the low-pass type) designed to a given standard. The filter is typically chosen from a set of filters having different topologies and/or orders embedded within the transmission and/or receive channels.

Certain criteria such as, for example, the passband width or the ripple, are variable depending on the type of transmission standard desired. Adapted topologies and/or filter orders allow the required performance to be attained. Consequently, depending on the transmission standard detected by the cellular phone or chosen by the user, one of the filters is connected to the transmission and/or receive channel for optimal filtering.

Conventionally, filters constructed from transconductance amplifiers are adapted to form the various aforementioned filters and, in particular, the Butterworth, Chebychev or elliptical type filters. For each cellular telephone, all filters required for the various standards had to be considered and selected according to the communications standard detected.

There is therefore a need for a filtering device with flexible architecture, and in particular, a filtering device from which using the same initial structure, the device can selectively present a different topology and/or an order.

SUMMARY

This disclosure provides a filtering device with a flexible architecture that can selectively present a different topology and/or order beginning with the same initial structure.

In one embodiment, the present disclosure provides a transconductance filtering circuit. The circuit includes an input, an output and a filter coupled between the input and the output. The circuit also includes two elementary cells of the same structure, wherein each of the elementary cells includes an interconnection having an open or closed state and connected to the input and the output. Each of the elementary cells also includes two elementary capacitors; and a transconductance amplifier unit connected in series between the two elementary capacitors. The amplifier unit has a first transconductance amplifier fed back onto itself via a second transconductance amplifier having a transconductance value opposite to that of the first amplifier. The circuit also includes a controller to open and close the interconnection depending on the desired configuration of the filtering.

In another embodiment, the present disclosure provides a filtering circuit for use in a communications system capable of operating according to several different transmission standards. The filtering circuit includes an input, an output and a filter coupled between the input and the output. The circuit also includes two elementary cells of the same structure. Each of the elementary cells includes a controllable interconnection having an open or closed state and connected to the input and the output and two elementary capacitors. The elementary cells also include a transconductance amplifier unit connected in series between the two elementary capacitors. The amplifier unit has a first transconductance amplifier fed back onto itself via a second transconductance amplifier having a transconductance value opposite to that of the first amplifier. The circuit also includes a processor to generate a configuration control signal depending on the desired transmission standard and desired configuration of the filter by opening and closing the controllable interconnection.

In still another embodiment, the present disclosure provides a method of filtering a circuit for use in a communications system capable of operating according to several different transmission standards. The method includes generating a configuration control signal to configure a filter coupled between an input and output of the circuit by opening and closing a controllable interconnection. The filter includes two elementary cells of the same structure. Each of the elementary cells includes a transconductance amplifier unit connected in series between two elementary capacitors. The amplifier unit has a first transconductance amplifier fed back onto itself via a second transconductance amplifier having a transconductance value opposite to that of the first amplifier.

Other technical feature may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
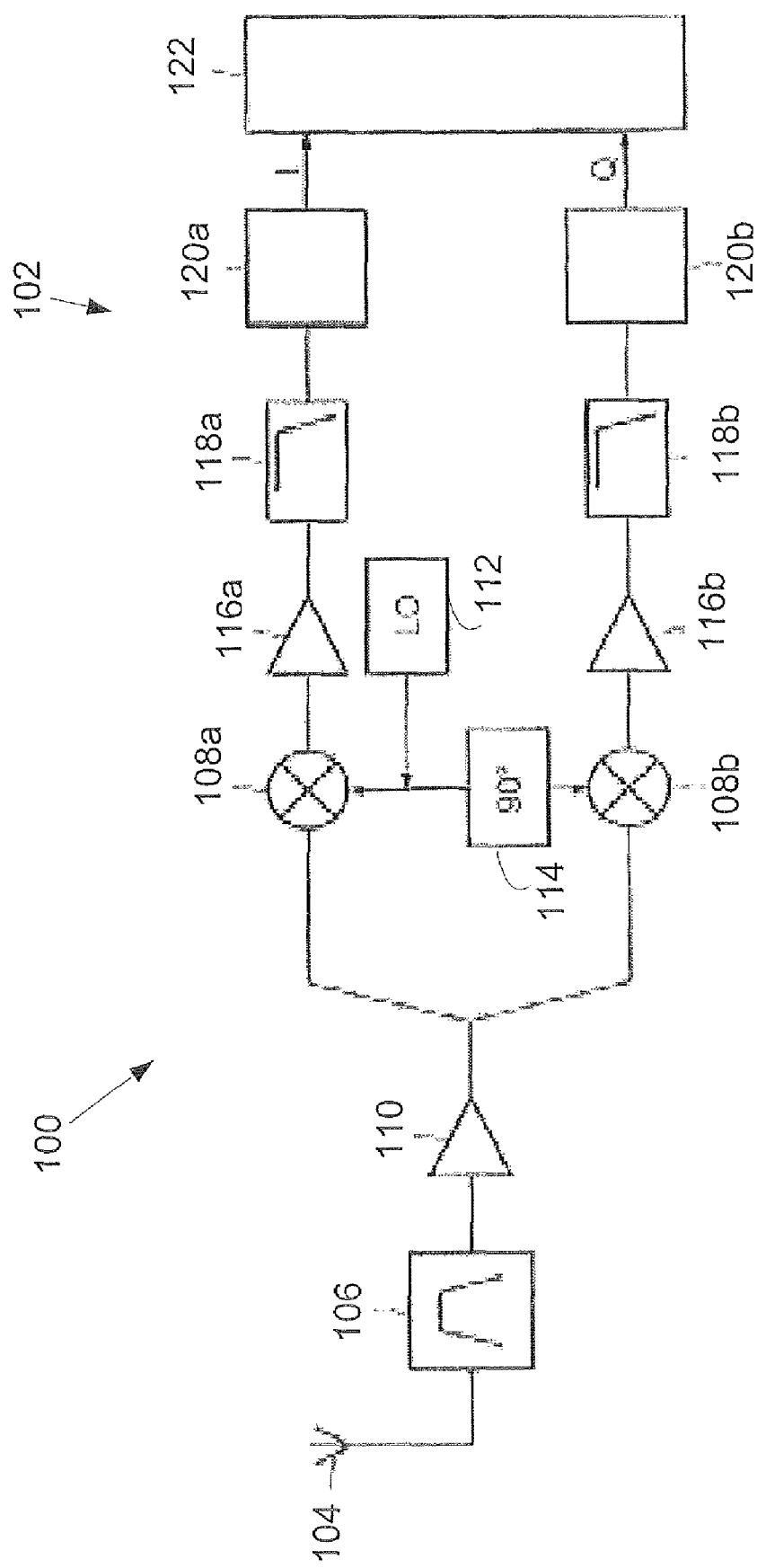
FIG. 1 describes schematically a part of a cellular mobile telephone incorporating one embodiment of a circuit according to the disclosure.

FIG. 1 generally illustrates the analog portion of a receive channel in a cellular mobile telephone (TP) 100. Telephone 100 includes a receive means (MREC) 102 connected to an antenna (ANT) 104. In this example, MREC 102 is configured for reception of the direct-conversion type. The antenna 104 is connected to a reception band selection filter (FS) 106. MREC 102 can, for example, be a tuning device or tuner, advantageously fabricated in an entirely integrated fashion on a silicon substrate. MREC may be, for example, of the zero-intermediate-frequency type. In other words, MREC 102 does not perform a frequency transposition to an intermediate frequency, but only comprises a single frequency-transposition stage comprising mixers 108a and 108b which perform a transposition directly into base band.

MREC 102 comprises at its front end a low-noise amplifier (LNA) 110 with variable gain connected between the selection filter 106 and the mixers 108a and 108b. A local oscillator (LO) 112 conventionally delivers a transposition signal to the mixer 108a, and to the mixer 108b via a 90-degree phase-shifter 114. The processing channel includes mixer 108a is therefore the reference channel (channel I), whereas the processing channel containing the mixer 108b is the quadrature channel (channel Q). Each mixer 108a and 108b for each channel I and Q is followed by a variable-gain amplifier, respectively 116a and 116b and VGA 2, which are followed by two filtering means, 118a and 118b, for example comprising low-pass filters, respectively connected to the inputs of analogue-digital converters 120a and 120b.

The analogue/digital converters 120a and 120b are connected to a digital processing stage comprising a processor (PRP) 122, commonly referred to as a 'base-band processor'. Preferably, the low-pass filters are formed using transconductance amplifiers with capacitors.

Figure 2:
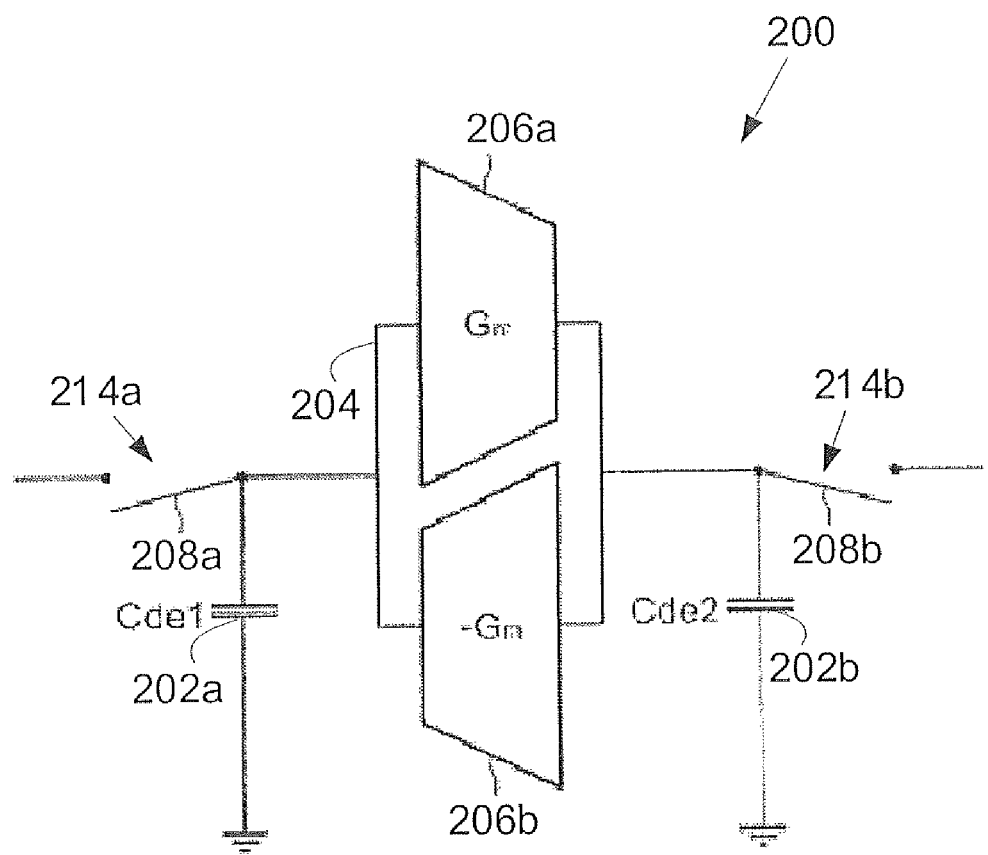
FIG. 2 describes one embodiment of an elementary cell according to an embodiment of the present disclosure.
Figure 2:
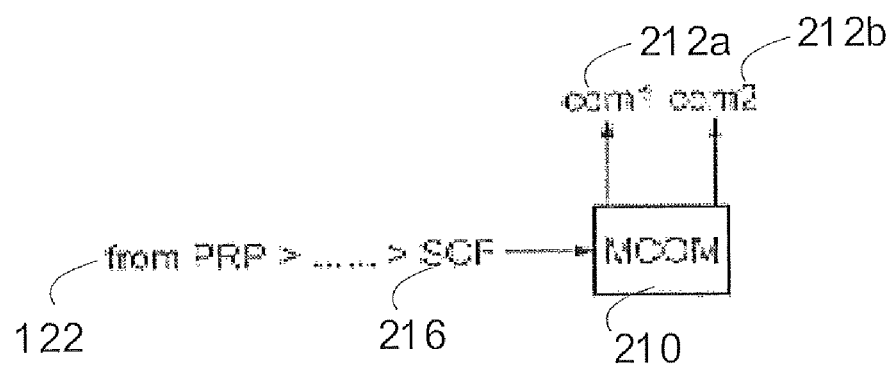

According to embodiments of the present disclosure, it is possible to selectively form different filters by using several (at least two) elementary cells of identical structure. The same elementary cell is repeated within the same filter and between the various filters, whatever their order and/or their topology. One embodiment of this elementary cell (CE) 200 according is shown in FIG. 2.

For the sake of simplification, in this description, the embodiments described relate, unless otherwise stated, to a 'single-ended' architecture. However, a differential implementation is of course possible, and may even be preferable in some applications. Those skilled in the art will know how to adapt the embodiments described hereinafter to a differential architecture.

Cell 200 comprises two elementary capacitors 202a and 202b connected to ground and a transconductance amplifier unit 204 comprising a structure of the gyrator type (AT1) 206a and (AT2) 206b, connected in series between the two capacitors. This gyrator structure comprises a first transconductance amplifier (AT1) 206a fed back onto itself via a second transconductance amplifier (AT2) 206b, having an opposite transconductance (GM) to that of the first amplifier. Controlled switches, 208a and 208b respectively, are connected to each input and output node of the elementary cell 200.

Control means (MCOM) 210 deliver the control signals (com1) 212a and (com2) 212b for the switches 214a and 214b, respectively. Control means (MCOM) 210 can be formed by logic circuits in a conventional manner. In the case of a telecommunications application, control means (MCOM) 210 can receive a configuration signal (SCF) 216 output from the base-band processor PRP 122 (shown in FIG. 1). Configuration signal 216 depends on the transmission standard used. Thus, the various filters desired can be formed using common elementary cells and other elementary cells connected according to the desired order or topology by means of the switches 214a and 214b.

Figure 3:
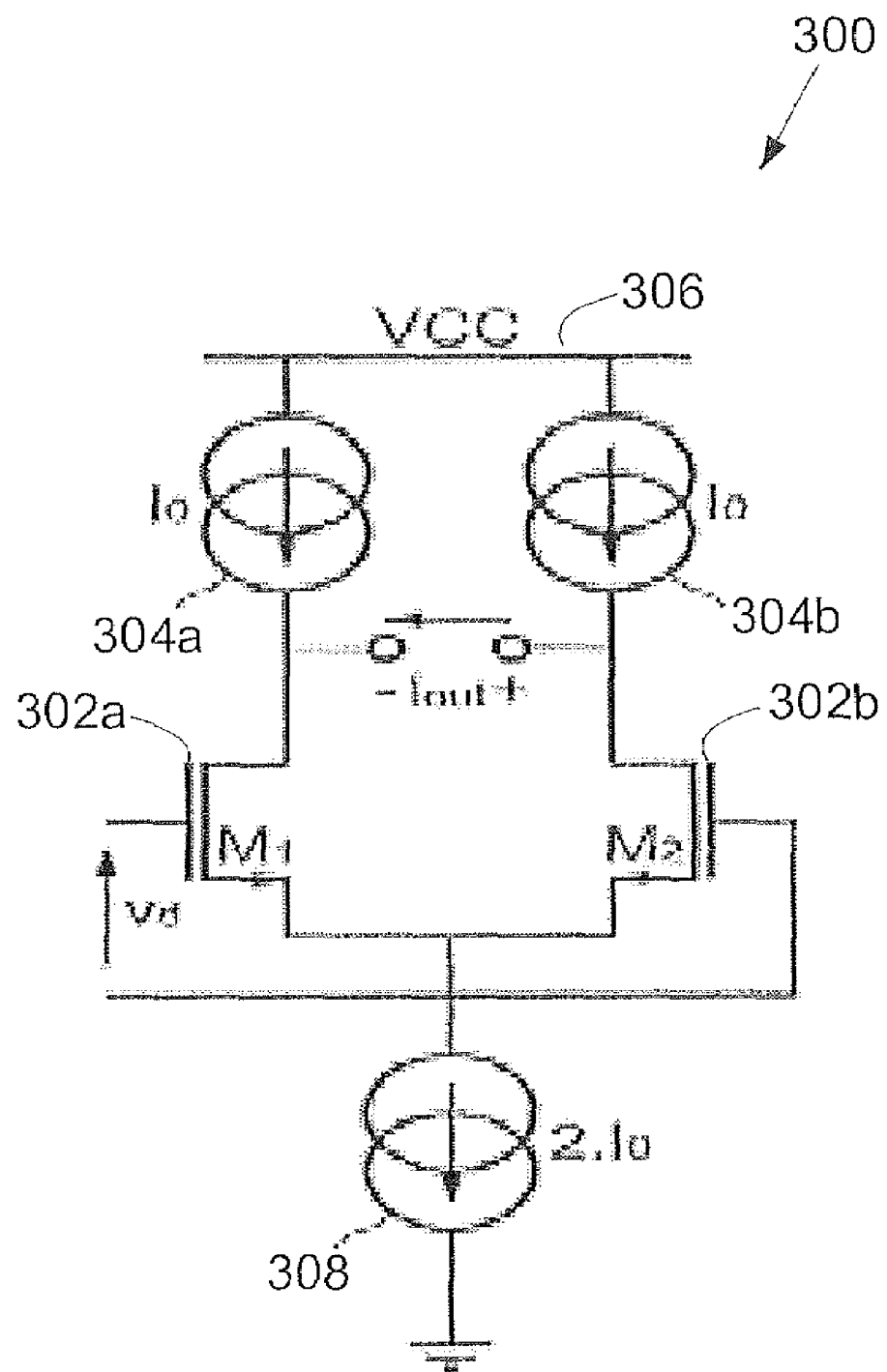
FIG. 3 describes in more detail one part of an example of elementary cell according to an embodiment of the present disclosure disclosure.

FIG. 3 illustrates an example of transconductance amplifier (AT) 300 used within the elementary cell 200 and using a differential architecture. The amplifier (AT) 300 receives a differential voltage $V_d$ at its input. This is applied between the two control electrodes (here the gates) of two transistors ($M_1$) 302a and ($M_2$) 302b, of the NMOS type, in this example. Each transistor ($M_1$) 302a and ($M_2$) 302b is biased by a current $I_0$, respectively delivered by the current sources (SC1) 304a and (SC2) 304b. The two current sources (SC1) 304a and (SC2) 304b are connected to a power supply terminal 306 delivering the voltage VCC.

The two output electrodes of the transistors ($M_1$) 302a and ($M_2$) 302b, here the sources, are common, and the common node is connected to a current source (SC3) 308 delivering a current of $2*I_0$. The current source (SC3) 308 is connected via its other terminal to ground. The output current $I_{out}$ delivered by the amplifier (AT) 300 is measured between the two input electrodes (here the drains) of the transistors ($M_1$) 302a and ($M_2$) 302b. This output current $i_{out}$ corresponds to the difference between the current measured on the input electrodes (the drains) and their respective bias currents $I_0$.

In the case where the amplifiers have opposite values of transconductance, the terminals of the differential input or the terminals of the differential output are reversed. A reconfigurable filtering circuit according to the disclosure also typically comprises input means, output means and filtering means comprising at least two cells and interconnection means, for example comprising switches. Generally speaking, the input and output means play an interface role between the filtering means and the components external to these filtering means and, in general, perform voltage/current and current/voltage conversions. These means are known per se.

Figure 4:
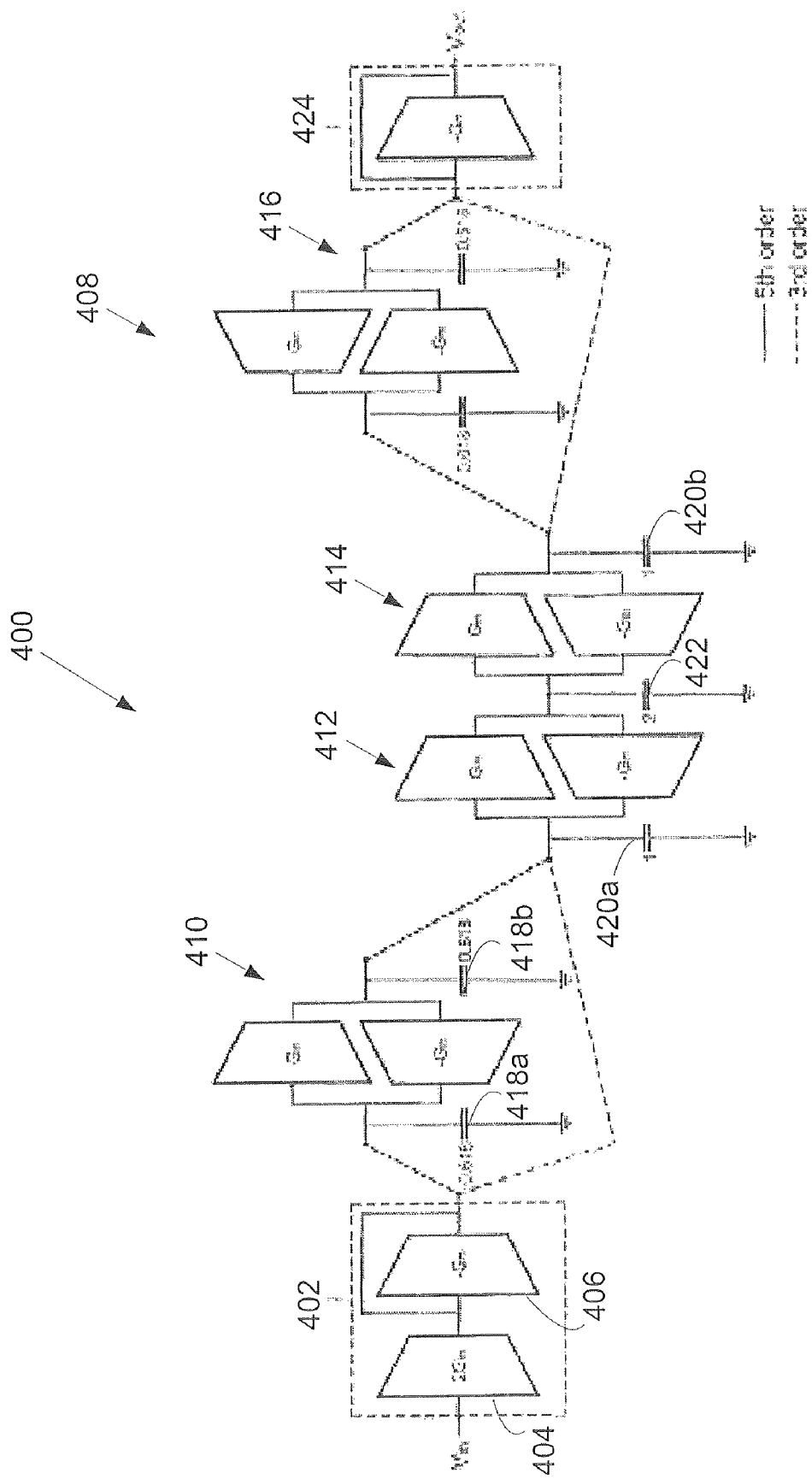
FIG. 4 illustrates an exemplary embodiment of two filters of different orders formed from elementary cells.

Reference is now made to FIG. 4 which illustrates a filtering circuit (CI) 400 according to one embodiment of the present disclosure that allows two low-pass third-order or fifth-order Butterworth filters to be formed. The circuit (CI) 400 receives at its input an input voltage $V_{in}$ delivered to the input means, here a voltage-current converter (CTI) 402, formed for example using a transconductance amplifier 404 with a transconductance equal to $2G_m$ (in order to compensate for the loss of a half of the signal resulting from the use of transconductance amplifiers with respect to a conventional filter of the RLC type in scale) connected in series with another transconductance amplifier 406 having a transconductance equal to $-G_m$ and whose output is fed back onto its input.

The converter (CTI) 402 furthermore plays the role of interface with the components connected upstream. The filtering means (MF) 408 here comprise four elementary cells, CE1 410, CE2 412, CE3 414 and CE4 416. The elementary cells CE1 410 and CE4 416 each comprise a structure of the gyrator type, such as is described hereinabove, and two capacitors 418a and 418b each having a relative value equal to 0.618. This relative value is determined as a function of a reference capacitive value used to calculate the cut-off frequency of the filtering means (MF) 408 according to the formula:

$$Fc = \frac{g_m}{2\pi C},$$

Fc being the cut-off frequency. The transconductance value and the reference capacitive value are adjusted in such a manner as to reach a compromise between the acceptable noise and power consumption. In other words, each value assigned to the capacitors of the filtering means (MF) 408 is a coefficient to be multiplied by the reference capacitive value.

The elementary cells CE2 412 and CE3 414 are formed from two structures of the gyrator type and from two capacitors 420*a* and 420*b* having 1 as the coefficient, the two capacitors connected to the common node being symbolized by a single capacitor 422 having a coefficient of 2. The filtering means (MF) 408 is connected to the output means, here a current-voltage converter CIT 424, delivering an output voltage $V_{out}$.

In a similar way to the converter CTI 402, the converter CIT 424 plays the role of interface with the components connected downstream. In order to form the fifth-order Butterworth filter, the switches will be controlled so as to connect the four elementary cells, CE1 410, CE2 412, CE3 414 and CE4 416, in series. In order to form a third-order Butterworth filter, the switches will allow the cells CE2 412 and CE3 414 to be directly connected to the voltage-current converter CTI 402 and to the current-voltage converter CIT 424. Thus, by reusing the two elementary cells CE2 412 and CE3 414 present for a third-order Butterworth filter, and by respectively adding the elementary cells CE1 410 and CE4 416 upstream and downstream, a fifth-order Butterworth filter can be constructed.

Figure 5A:
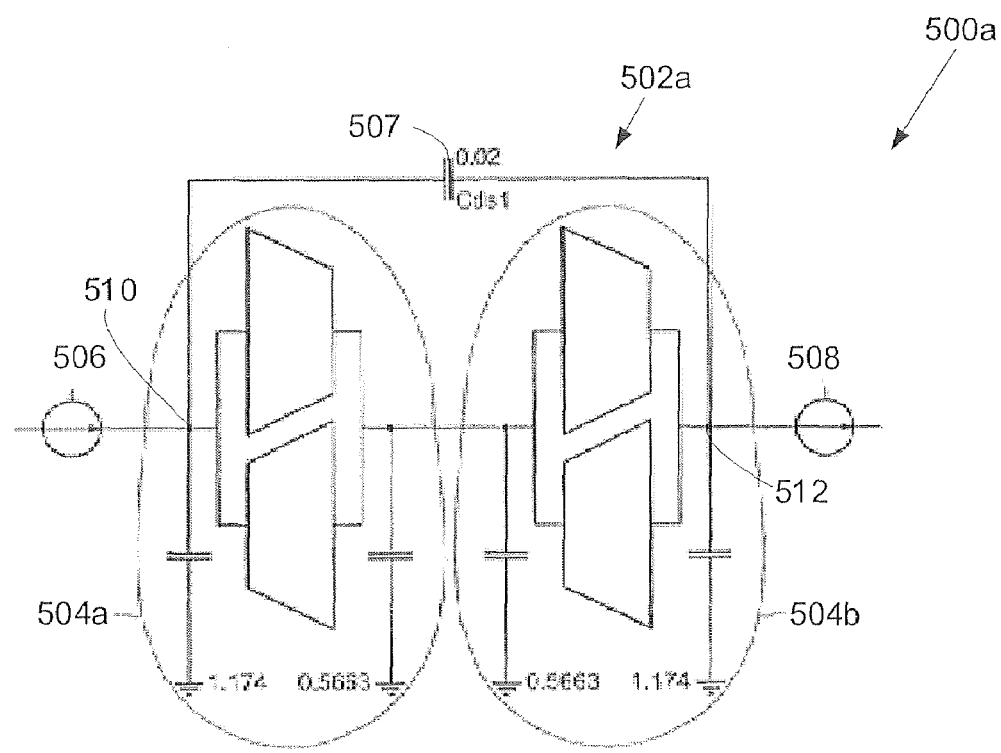
FIGS. 5A, 5B, and 5C illustrate one embodiment of a circuit according to an embodiment of the disclosure that allows two filters of different topology to be formed.
Figure 5B:
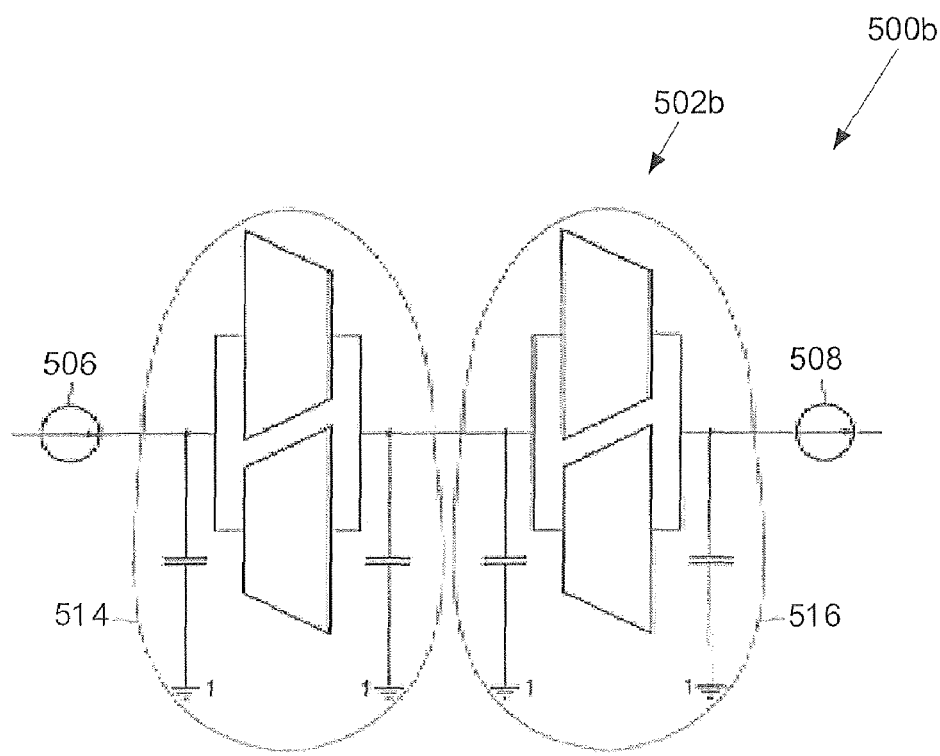
Figure 5C:
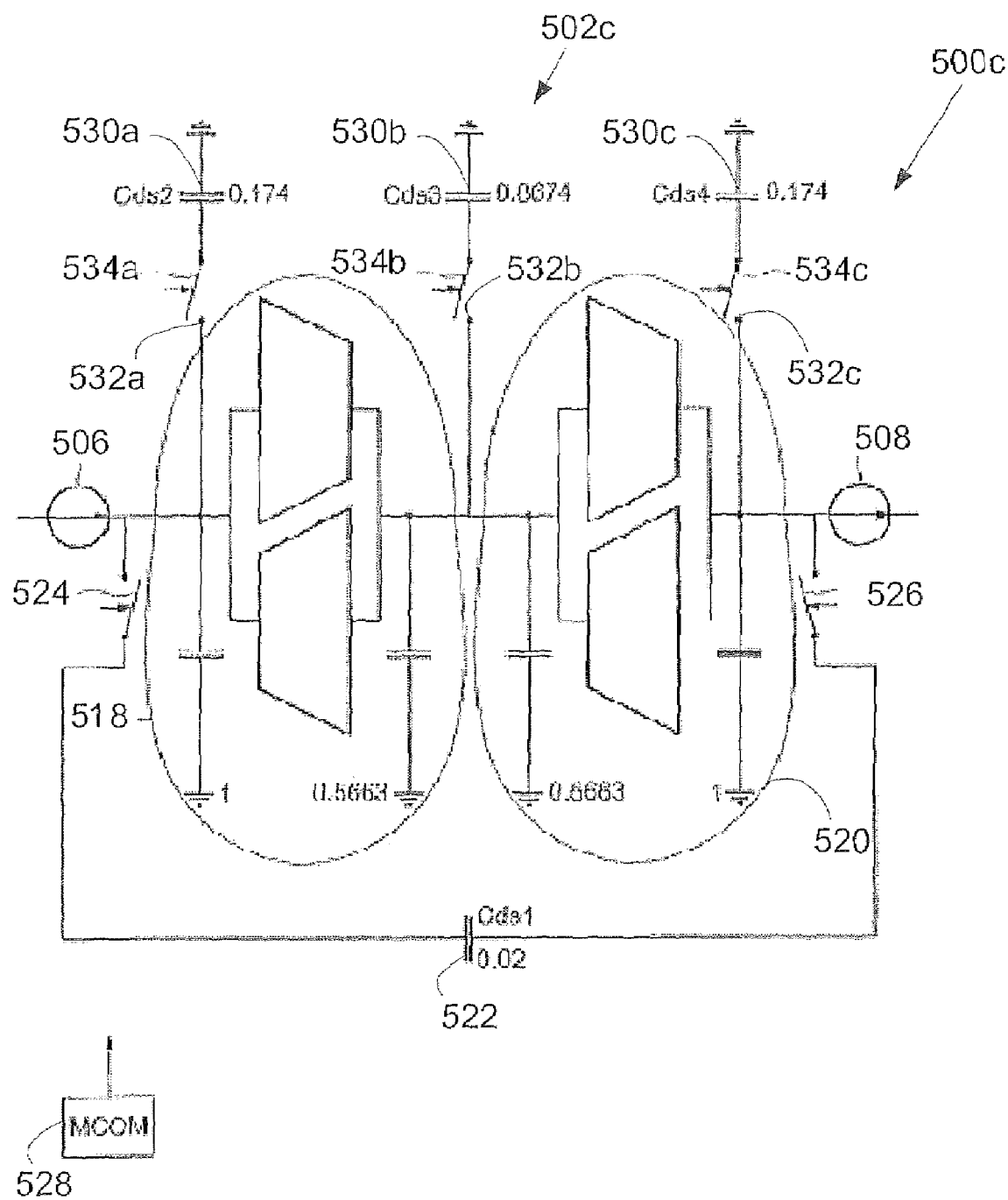

Reference is now made to FIGS. 5A, 5B and 5C. FIG. 5a shows third-order filter 500*a*, 500*b* and 500*c*, of the elliptical type. The filtering means (MF) 502*a* includes, in this example, two elementary cells CE1 504*a* and CE2 504*b* connected in series between an input voltage-current converter CTI 506 and an output current-voltage converter CIT 508. The capacitors of the elementary cells CE1 504*a* and CE2 504*b* each have a coefficient of 1.174 and 0.5663. Furthermore, the filter comprises an additional capacitor ($C_{ds1}$) 507, here with a coefficient of 0.02, connected in parallel between the first terminal 510 of the elementary cell CE1 504*a* and the second terminal 512 of the elementary cell CE2 504*b*.

In FIG. 5B, a filter 500*b* of the third-order Butterworth type is shown including filtering means (MF) 502*b*. Filtering means 502*b* includes two elementary cells CE3 514 and CE4 516 connected in series between the voltage-current converter CTI 506 and the current-voltage converter CIT 508. The capacitors of the two elementary cells CE3 514 and CE4 516 each have a value of unity.

FIG. 5C shows filtering means (MF) 502*c* according to the disclosure that allow the third-order elliptical and Butterworth filters to be constructed illustrated in FIGS. 5A and 5B. For this purpose, the filtering means (MF) 502*c* comprise two elementary cells CE5 518 and CE6 520 connected in series between an input voltage-current converter CTI 506 and an output current-voltage converter CIT 508. The capacitors of the elementary cells CE5 518 and CE6 520 have coefficients of 1 and 0.5663. The additional capacitor $C_{ds1}$ 522 is connected in parallel with two elementary cells CE5 518 and CE6 520 via two switches INT1 524 and INT2 526, controlled by a signal delivered by the control means MCOM 528.

The filtering means MF 502*c* also includes three other auxiliary capacitors, $C_{ds2}$ 530, $C_{ds3}$ 530*b* and $C_{ds4}$ 530*c*, having in this example respective coefficients 0.174, 0.8674 and 0.174. These three auxiliary capacitors, $C_{ds2}$ 530, $C_{ds3}$ 530*b* and $C_{ds4}$ 530*c*, are respectively connected to the first terminal 532*a* of the elementary cell CE5 518, to the common terminal 532*b* of the elementary cells CE5 518 and CE6 520, and to the second terminal 532*c* of the elementary cell CE6 520, via three switches INT3 534*a*, INT4 534*b* and INT5 534*c*. These switches are controlled by a control signal delivered by the control means MCOM 528. When the switches INT1 524, INT2 526, INT3 534*a* and INT5 534*c* are closed, and the switch INT4 534*b* is the open position, the filtering means (MF) 502*c* reproduces the filter of order 3, of the elliptical type, illustrated in FIG. 5C.

Conversely, when the switch INT4 534*b* is in the closed position and the switches INT1 524, INT2 526, INT3 534*a* and INT5 534*c* are in the open position, the filtering means (MF) 502*c* reproduces the filter of order 3, of the Butterworth type, illustrated in FIG. 5B. By reusing the same elementary cells and by controlling their connection as a function of an external parameter, for example a communications standard, it is possible to reduce the silicon surfaces areas of the filtering means by up to 25% for certain filter topologies. Furthermore, the filters 500*a*, 500*b* and 500*c* shown have perfect symmetry, a fact which considerably improves the matching performances of the circuits formed for certain types of filters.

Aside from the application in the field of telecommunications, the disclosure is particularly suited to audio applications, or any signal processing system requiring an analogue filtering. Another goal of the disclosure is to provide a filtering device adapted to various transmission standards, while at the same time limiting the silicon surface area for its fabrication together with the power consumption.

According to one aspect of the disclosure, a transconductance filtering circuit is provided comprising input means, output means and filtering means coupled between the input means and the output means. According to a general feature of this aspect of the disclosure, the filtering means are configurable by means of at least two elementary cells of the same structure and of controllable interconnection means each having an open or closed state, and being connected to the elementary cells and to the input and output means. Each elementary cell comprises two elementary capacitors and a transconductance amplifier unit connected in series between the two elementary capacitors. The said unit comprises a first transconductance amplifier fed back onto itself via a second transconductance amplifier having a transconductance value opposite to that of the first amplifier. The circuit also comprises control means capable of opening or closing the interconnection means depending on the desired configuration of the filtering means. In other words, the filtering circuit comprises several elementary cells with the same structure.

The various elementary cells are interconnected as a function of the desired filter, in particular depending on the topology and/or on the order of the desired filter. Thus, starting from an assembly of elementary cells, it is possible to form various filters with different orders, or else with different topologies, or with different orders and topologies. Furthermore, the disclosure also has the advantage of allowing the transmission 'zeros', characteristic of the transfer functions of some filters (for example, Chebychev filters or elliptical filters) to be easily created by means of capacitors coupled in parallel with the elementary cells defined hereinabove.

The filtering circuit 500*a*, 500*b* or 500*c* can have an architecture of the 'single-ended' or unipolar type, or else, preferably, of the differential type. The filtering means can also comprise at least one additional capacitor connected in parallel with the terminals of at least one elementary cell, and the controllable interconnection means are also connected to the said additional capacitor. For example, starting from the various elementary cells and from the additional capacitors, it is possible to form Butterworth, Chebychev or also elliptical filters of different orders. The additional capacitor can be connected in parallel with the terminals of several elementary cells connected in series. So as to be able to adapt the value of the elementary capacitors of the elementary cells of the filtering means, the latter comprises at least two auxiliary capacitors respectively connected to each terminal of the amplifier unit of at least one cell via the interconnection means. For example, the interconnection means comprise controllable switches.

According to one embodiment, the filtering means 502a, 502b, or 502c can for example form a low-pass filter. According to one embodiment, the circuit such as is described hereinabove forms an integrated circuit. According to another aspect, the disclosure provides an element of a communications system capable of operating according to several different transmission standards, incorporating a circuit as defined above, processing means capable of delivering a configuration control signal by means of a command depending on the desired transmission standard, in such a manner as to obtain the desired configuration of the filtering means. In other words, instead of providing for each element of the communications system all of the filters required for the communications standards that can be encountered, all of the filters are formed by means of the filtering circuit according to the disclosure. Depending on the communications standard detected, the elementary cells of the filtering circuit required to form the adapted filter are selected and connected in such a manner as to obtain the configuration desired for the filtering means. For example, the element can be an element of a wireless communications system forming, in particular, a cellular mobile telephone.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transconductance filtering circuit comprising:
   an input;
   an output;
   a filter coupled between the input and the output, the filter having at least two elementary cells of the same structure connected in series, and a first capacitor connected in parallel with the at least two elementary cells, wherein each of the elementary cells comprises:
      an interconnection having an open or closed state and connected to the input and the output;
      two elementary capacitors; and
      a transconductance amplifier unit connected in series between the two elementary capacitors, the amplifier unit having a first transconductance amplifier fed back onto itself via a second transconductance amplifier having a transconductance value opposite to that of the first transconductance amplifier; and
   the transconductance filtering circuit further comprising a controller to open and close the interconnection depending on the desired configuration of the filtering.

2. The transconductance filtering circuit according to claim 1, wherein the first capacitor is connected to the interconnection.

3. The transconductance filtering circuit according to claim 2, wherein the first capacitor is connected in parallel with the terminals of more than two elementary cells.

4. The transconductance filtering circuit according to claim 3, wherein the several elementary cells are connected in series.

5. The transconductance filtering circuit according to claim 1, wherein the filter comprises at least two auxiliary capacitors respectively connected to each terminal of the amplifier unit of at least one cell via the interconnection.

6. The transconductance filtering circuit according to claim 1, wherein the interconnection comprise a controllable switch.

7. The transconductance filtering circuit according to claim 1, wherein the filter is a low-pass filter.

8. The transconductance filtering circuit according to claim 1, wherein the filter forms an integrated circuit.

9. For use in a communications system capable of operating according to several different transmission standards, a filtering circuit comprising:
   an input;
   an output;
   a filter coupled between the input and the output, the filter having at least two elementary cells of the same structure connected in series, and a first capacitor connected in parallel with the at least two elementary cells, wherein each of the elementary cells comprises:
      a controllable interconnection having an open or closed state and connected to the input and the output;
      two elementary capacitors; and
      a transconductance amplifier unit connected in series between the two elementary capacitors, the amplifier unit having a first transconductance amplifier fed back onto itself via a second transconductance amplifier having a transconductance value opposite to that of the first transconductance amplifier; and
   the transconductance filtering circuit further comprising a processor to generate a configuration control signal depending on the desired transmission standard and desired configuration of the filter by opening and closing the controllable interconnection.

10. The filtering circuit according to claim 9, wherein the first capacitor is connected to the interconnection.

11. The filtering circuit according to claim 10, wherein the first capacitor is connected in parallel with the terminals of more than two elementary cells connected in series.

12. The filtering circuit according to claim 9, wherein the filter comprises at least two auxiliary capacitors respectively connected to each terminal of the amplifier unit of at least one cell via the interconnection.

13. The filtering circuit according to claim 9, wherein the interconnection comprise a controllable switch.

14. The filtering circuit according to claim 9, wherein the filter is a low-pass filter.

15. The filtering circuit according to claim 9, wherein the filter forms an integrated circuit.

16. The filtering circuit according to claim 9, wherein the communication system is a cellular mobile telephone system.

17. For use in a communications system capable of operating according to several different transmission standards, a method of operating a filtering circuit, the method comprising:
generating a configuration control signal to configure a filter coupled between an input and output of the circuit by opening and closing a controllable interconnection, the filter comprising:
at least two elementary cells of the same structure connected in series, and a first capacitor connected in parallel with the at least two elementary cells, wherein each of the elementary cells comprises a transconductance amplifier unit connected in series between two elementary capacitors, the amplifier unit having a first transconductance amplifier fed back onto itself via a second transconductance amplifier having a transconductance value opposite to that of the first amplifier.

18. The method according to claim 17, wherein the first capacitor is connected to the interconnection.

19. The method according to claim 17, wherein the first capacitor is connected in parallel with the terminals of more than two elementary cells connected in series.

20. The method according to claim 17, wherein the filter comprises at least two auxiliary capacitors respectively connected to each terminal of the amplifier unit of at least one cell via the interconnection.

* * * * *

UNITED STATES PATENT AND TRADEMARK OFFICE
CERTIFICATE OF CORRECTION

PATENT NO. : 7,511,570 B2
APPLICATION NO. : 11/648146
DATED : March 31, 2009
INVENTOR(S) : David Chamla, Andreia Cathelin and Andreas Kaiser It is certified that error appears in the above-identified patent and that said Letters Patent is hereby corrected as shown below:

Column 8, Claim 4, line 13, delete "several" and replace with -- more than two --.

Signed and Sealed this

Sixteenth Day of November, 2010

David J. Kappos
*Director of the United States Patent and Trademark Office*